(12) United States Patent
Lee

(10) Patent No.: US 11,505,493 B2
(45) Date of Patent: Nov. 22, 2022

(54) METHOD OF TREATING SURFACE OF QUARTZ MEMBER AND QUARTZ MEMBER OBTAINED BY SAME

(71) Applicant: SEMES CO., LTD., Cheonan-si (KR)

(72) Inventor: Su Hyung Lee, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/097,066

(22) Filed: Nov. 13, 2020

(65) Prior Publication Data

US 2021/0147287 A1    May 20, 2021

(30) Foreign Application Priority Data

Nov. 15, 2019  (KR) .................. 10-2019-0146829

(51) Int. Cl.
| | |
|---|---|
| *C03C 15/00* | (2006.01) |
| *C03C 19/00* | (2006.01) |
| *H01J 37/32* | (2006.01) |
| *C03C 3/06* | (2006.01) |

(52) U.S. Cl.
CPC .............. *C03C 15/00* (2013.01); *C03C 19/00* (2013.01); *C03C 3/06* (2013.01); *H01J 37/32467* (2013.01)

(58) Field of Classification Search
None
See application file for complete search history.

(56) References Cited

U.S. PATENT DOCUMENTS

| | | | | |
|---|---|---|---|---|
| 6,458,445 | B1 * | 10/2002 | Inaki ....................... | C03C 17/22 428/428 |
| 7,404,910 | B1 | 7/2008 | Kezuka et al. | |
| 2003/0190483 | A1 * | 10/2003 | Inaki ........................ | C03C 3/06 118/728 |
| 2006/0019103 | A1 * | 1/2006 | Abe .......................... | C03C 3/062 428/428 |
| 2008/0193715 | A1 * | 8/2008 | Weber ...................... | C03C 15/00 428/141 |
| 2008/0261381 | A1 * | 10/2008 | Akiyama ............. | H01L 21/3046 438/459 |
| 2009/0267270 | A1 * | 10/2009 | Murakami ............ | B29C 39/148 264/447 |

FOREIGN PATENT DOCUMENTS

| | | | |
|---|---|---|---|
| JP | 10-70099 A | * | 3/1998 |
| JP | 2011-014628 | | 1/2011 |
| KR | 10-2005-0019721 | | 3/2005 |
| KR | 10-1606793 B1 | | 2/2016 |
| KR | 10-1684344 | | 12/2016 |
| KR | 10-2019817 B1 | | 3/2019 |
| RU | 1739826 | * | 1/1995 |

* cited by examiner

*Primary Examiner* — Shamim Ahmed

(57) ABSTRACT

Disclosed is a method of treating the surface of a quartz member. The method can remove a masking material generated by a chemical reaction between the quartz member and an etching solution, thereby completely removing scratches on the surface of the quartz member without interrupting the treatment process unlike existing technologies. The method also embosses the surface of the quartz member, thereby increasing the frictional resistance and surface roughness of the surface of the quartz member depending on the shape or density of protrusions on the surface. In addition, the method prevents deposits on the surface of the quartz member from peeling off.

13 Claims, 7 Drawing Sheets

METHOD OF TREATING SURFACE OF QUARTZ MEMBER AND QUARTZ MEMBER OBTAINED BY SAME

CROSS REFERENCE TO RELATED APPLICATION

The present application claims priority to Korean Patent Application No. 10-2019-0146829, filed Nov. 15, 2019, the entire contents of which are herein incorporated by reference.

BACKGROUND OF THE INVENTION

1. Field of the Invention

The present invention relates to a method of treating the surface of a quartz member and to a quartz member prepared by the same.

2. Description of the Related Art

Quartz is a material having high purity (99.999%), high chemical stability, high acidity resistance, high thermal resistance (softening point of 1683° C.), good light permeability, low thermal expansion, and good electrical insulation, making it widely applied in manufacturing semiconductor devices. For example, in a plasma treatment apparatus for plasma treatment on a substrate such as a silicon wafer, a chamber defining a plasma generation space is famed as a quartz dome.

Quartz is machined into a quartz member with a desired shape and then the surface roughness of the produced quartz member is regulated to a certain extent through sand blasting or mechanical polishing. However, this roughness regulation process may lead to defects such as fine cracks in a surface layer of the quartz member. The defective surface layer acts as a particle source in a substrate treatment process performed in harsh conditions using plasma or corrosive gas.

Some techniques that use chemical etching to regulate the surface roughness of a quartz member are disclosed. These techniques make it difficult for a layer of byproducts formed on the surface to peel off during the treatment of the surface. For example, Korean Patent No. 1606793 discloses a technique of etching quartz surfaces with an etching solution containing fluoric acid (HF) as a main composition and an additive such as ammonium fluoride ($NH_4HF_2$). These techniques are useful for adjustment of the surface roughness range of a quartz member. However, it is difficult to properly adjust the surface roughness and to completely remove surface defects such as fine cracks using the techniques.

DOCUMENT OF RELATED ART

Patent Document (Patent Document 1) Korean Patent No. 10-2019817
(Patent Document 2) Korean Patent No. 10-1606793

SUMMARY OF THE INVENTION

An objective of the present invention is to provide a method of treating the surface of a quartz member by removing all scratches formed on the surface of the quartz member through a mechanical process such as sandblasting, and a quartz member prepared by the same.

According to one embodiment of the present invention, one aspect of the present invention provides a method of treating a surface of quartz member, the method including a first surface treatment step in which a surface of a quartz member is etched with a high concentration etching solution to remove a crack or scratch; and a second surface treatment step in which the surface of the quartz member resulting from the first treatment step is etched with a low concentration etching solution to adjust a surface roughness of the quartz member.

The first surface treatment step may etch the quartz member to a depth of 100 μm or more from the surface of the quartz member.

The quartz member resulting from the second surface treatment step may have a surface roughness Ra of 0.1 to 1 μm.

The high concentration etching solution may include fluoric acid (HF) and a first additive. The first additive may be one of sulfuric acid, nitric acid, and hydrochloric acid that are materials capable of removing reaction by-products generated during etching. The reaction by-products may include $(NH_4)_2SiF_6$ or $H_2SiF_6$.

The low concentration etching solution may include fluoric acid (HF) and a second additive. The second additive may be an organic solvent. The organic solvent may include at least one of dimethylformamide, dimethyl sulfoxide, acetonitrile, tetrahydrofuran, methyl ethyl ketone, and dioxane.

The first surface treatment step may be performed at a relatively high temperature and the second surface treatment step may be performed at a relatively low temperature.

The quartz member may be a member used in a plasma treatment apparatus or a member used in a state of being exposed to a plasma environment.

The method may further include sandblasting the surface of the quartz member prior to the first surface treatment step.

Another aspect of the present invention provides a quartz member manufactured by the surface treatment method described above.

The quartz member may have a vertical maximum step Rt of 20 μm or less on a surface thereof.

A further aspect of the present invention provides a method of manufacturing a plasma treatment apparatus including a quartz member. The method includes a sandblasting step of sandblasting a surface of a quartz member, a first surface treatment step of etching the sandblasted surface of the quartz member with a high concentration etching solution containing a first additive, a second surface treatment step of etching the surface of the quartz member passing through the first surface treatment step with a low concentration etching solution containing a second additive, and a placement step of placing the quartz member in a plasma chamber.

The quartz member may have a dome shape.

The surface treatment method according to one embodiment of the present invention uses a high concentration etching solution containing a first additive such as sulfuric acid, thereby completely removing defects such as scratches on the surface of a quartz member without forming a masking layer that interferes with an etching reaction during the etching process. In addition, when the surface of a quartz member is embossing-treated, the frictional resistance and surface roughness of the treated surface are increased depending on the shape or density of embosses, thereby preventing a deposition film formed on the surface during a chemical vapor deposition process from peeling off.

The effects, features, and objectives of the present disclosure are not limited to the ones mentioned above, and other effects, features, and objectives not mentioned above can be clearly understood by those skilled in the art from the following description.

BRIEF DESCRIPTION OF THE DRAWINGS

The above and other objectives, features, and other advantages of the present invention will be more clearly understood from the following detailed description taken in conjunction with the accompanying drawings, in which.

DESCRIPTION OF THE PREFERRED EMBODIMENTS

Figure 1:
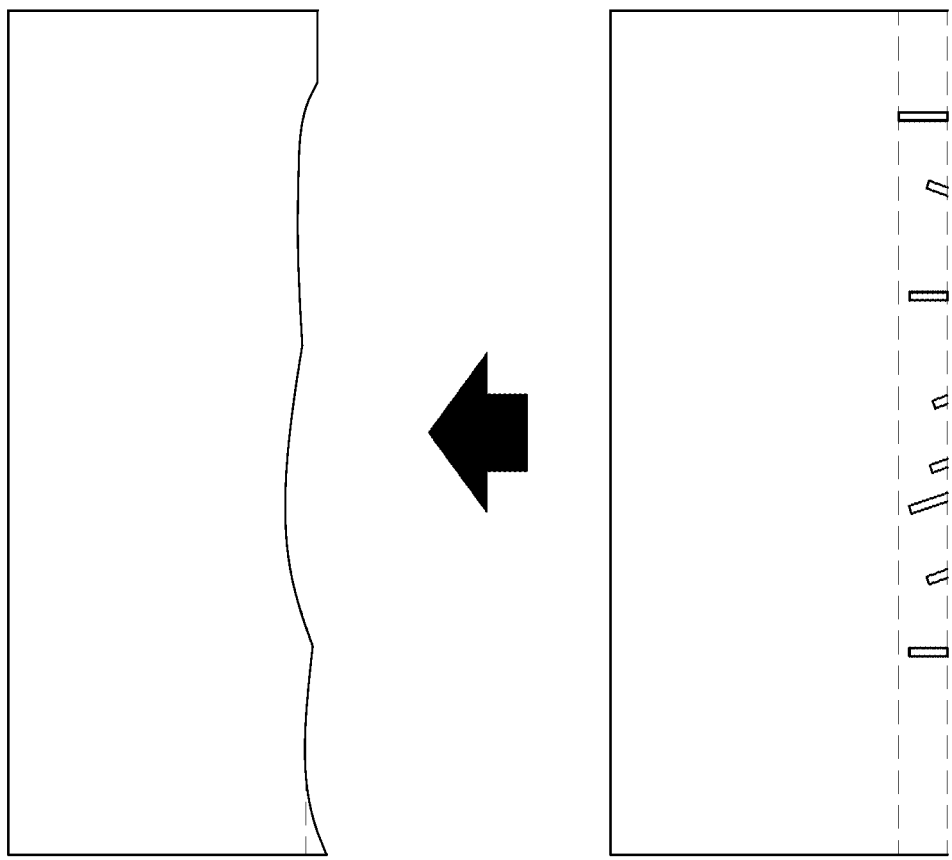
FIG. 1 is a diagram illustrating a surface of a quartz member having undergone a surface treatment method according to one embodiment of the present invention.

Hereinbelow, exemplary embodiments of the present invention will be described in detail with reference to the accompanying drawings such that the invention can be easily practiced by those ordinarily skilled in the art to which the present invention pertains. The present invention can be embodied in various foams and should not be construed as being limited to the exemplary embodiments disclosed herein.

A description of elements that are not related to the invention will be omitted to clarify the invention, and identical or similar elements are denoted by identical or similar reference characters throughout the drawings and the detailed description below.

In addition, unless otherwise defined, all terms including technical and scientific terms used herein have the same meaning as commonly understood by those who are ordinarily skilled in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A method of treating a surface of a quartz member for use in a semiconductor manufacturing apparatus includes a sandblasting process.

The sandblasting process is a process of mechanically processing the surface of a quartz member to form an embossed surface. However, when sandblasting is performed, scratches are likely to occur on the surface of the quartz member due to chipping or cracking.

During the manufacturing of semiconductor devices, deposits on a quartz member may peel off due to the difference in thermal expansion coefficient between the quartz member and the deposits formed on the surface of the quartz member, resulting in generation of particles serving as contaminants.

Accordingly, as illustrated in FIG. 1, according to the present invention, the scratches on the surface of a quartz member are first completely removed and then an embossing process is performed on the scratch-free surface of the quartz member. According to the present invention, it is possible to provide a quartz member that is free of scratches and has an embossed surface satisfying a suitable surface roughness. That is, when the frictional resistance and surface roughness of the surface of the quartz member are increased by controlling the shape or density of embosses on the surface, deposits on the surface are prevented from peeling off.

Figure 2:
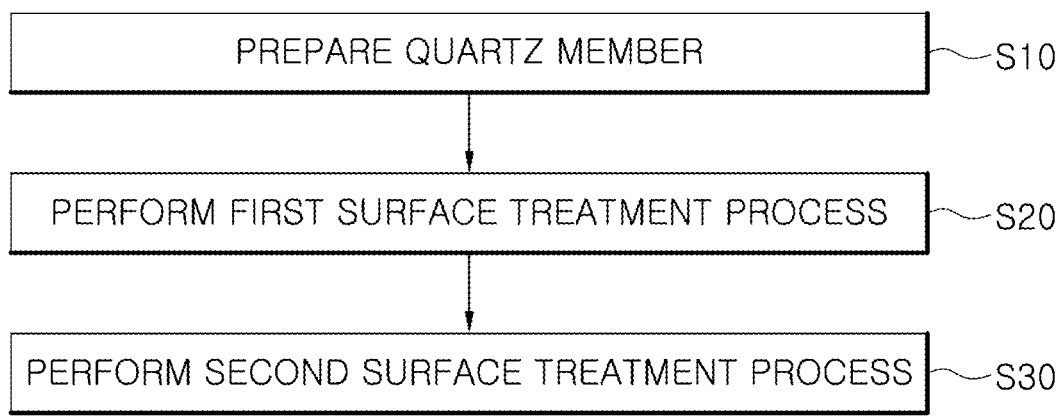
FIG. 2 is a flowchart illustrating a method of treating a surface of a quartz member, according to one embodiment of the present invention.

As illustrated in FIG. 2, according to one embodiment of the present invention, a surface treatment method for a quartz member includes a quartz member preparation step S10, a first surface treatment step S20, and a second surface treatment step S30.

The quartz member preparation step S10 is a step of preparing a quartz member through a mechanical process such as sandblasting.

The quartz member prepared as described above undergoes the first surface treatment step S20.

In the first surface treatment step S20, it is preferable to use a high concentration etching solution. The high concentration etching solution preferably includes fluoric acid (HF) and a first additive.

When the first additive is strong acid, the strong acid is preferably sulfuric acid, nitric acid, or hydrochloric acid.

The concentration of the high concentration etching solution is sufficient if it is higher than that of an etching solution used in the second surface treatment step S30. The reason for using the high concentration etching solution in the first surface treatment step is to quickly remove surface scratches and the like by increasing the etching rate.

Furthermore, the reason for using acid as the first additive is to remove masking materials generated during the etching, thereby removing all the scratches on the surface of the quartz member after the sandblasting.

Figure 3:
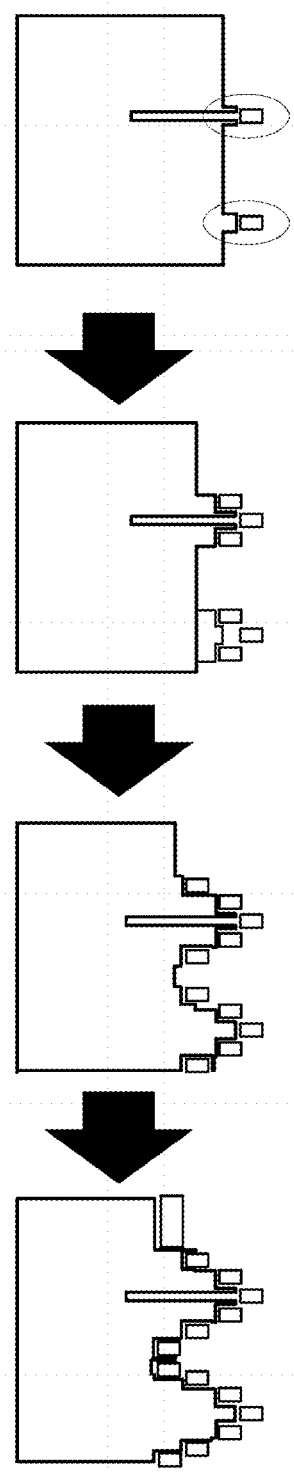
FIG. 3 is a diagram illustrating a surface of a quartz member at each step of a surface treatment method for a quartz member, according to a conventional art.

In the case of a related art in which an etching process is performed with an etching solution including fluoric acid (HF) as a main component and ammonium fluoride ($NH_4HF_2$) as an additive after a sandblasting process, as illustrated in FIG. 3, a masking material 13 is formed on the surface of a quartz member during the etching process. That is, as indicated by a reaction formula shown below, quartz and ammonium fluoride ($NH_4HF_2$) react with each other to produce ammonium hexafluorosilicate (($NH_4)_2SiF_6$) as a reaction product.

$$SiO_2 + 4HF + 2NH_4HF_2 \rightarrow 2H_2O + (NH_4)_2SiF_6$$

The resulting ammonium hexafluorosilicate (($NH_4)_2SiF_6$) is present on the surface of the quartz member and acts as a masking material 13 that interferes with removal of scratches on the surface of the quartz member. Therefore, it is difficult to uniformly etch the surface 12 of the quartz member and to remove cracks or chippings with a certain depth. As illustrated in FIG. 3, while the surface treatment is in progress, the production of the masking material 13 increases, resulting in uneven etching of the surface of the quartz member.

Figure 4:
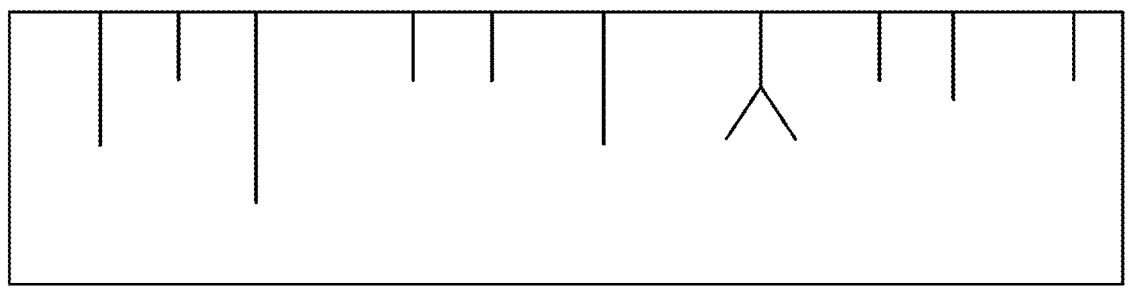
FIG. 4 is a schematic diagram illustrating a first surface treatment step according to the present invention.
Figure 4:
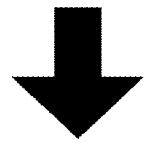
Figure 4:
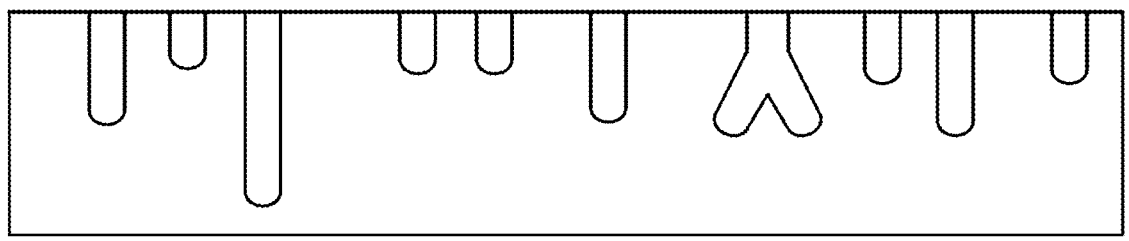
Figure 4:
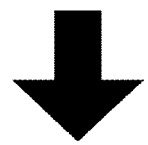
Figure 4:
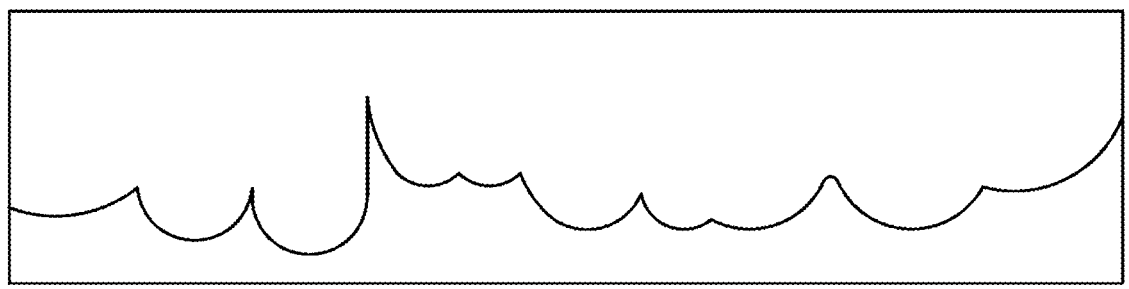

Unlike the this process, the high concentration etching solution used in one embodiment of the present invention includes a first additive capable of removing by-products serving as masking materials produced by an etching reaction. Therefore, the masking materials generated during the etching process interfere with the etching of the surface of the quartz member, resulting in imperfect removal of scratches on the surface. For example, when using a high concentration etching solution including fluoric acid (HF) as a main component and sulfuric acid ($H_2SO_4$) as the first additive, the masking material may be removed as described in Reaction Formulas 1 to 3. That is, $H_2SiF_6$, which acts as a masking material, is produced by the reaction of quartz ($SiO_2$) and fluoric acid (HF) but is removed by the reaction with sulfuric acid ($H_2SO_4$), which is the first additive, as shown in Reaction Formula 3. Accordingly, as illustrated in FIG. 4, chippings or cracks with a predetermined depth range can be completely removed through the first surface treatment step S20.

$$SiO_2 + 4HF \rightarrow SiF_4 + 2H_2O \tag{1}$$

$$SiO_2 + 6HF \rightarrow H_2SiF_6 + H_2O \tag{2}$$

$$H_2SiF_6 + SiF_4 + H_2SO_4 \rightarrow 2SiF_4 + 2HF + H_2SO_4 \tag{3}$$

The first surface treatment step is preferably performed at a relatively high temperature compared to the second surface treatment step. When performed at high temperatures, the reaction between the quartz member and the high concentration etching solution can actively occur.

When the first surface treatment step according to the present invention is performed, all fine scratches that are not visually identified can be removed. To this end, the first surface treatment step S20 is performed to an etching depth of at least 100 μm from the top surface. Since the masking material generated during the etching process is removed by the first additive, it is possible to prevent scratches from remaining due to the action of the masking material.

After performing the first surface treatment step S20, the second surface treatment step S30 is performed. In the second surface treatment step S30, it is preferable to use a low concentration etching solution.

Figure 5:
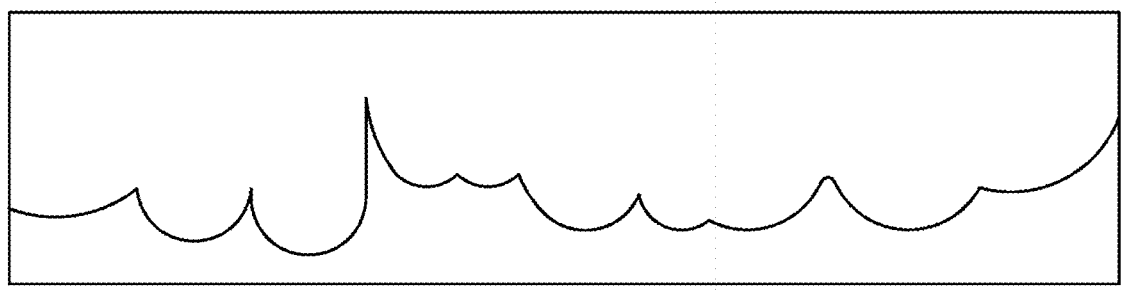
FIG. 5 is a schematic diagram illustrating a second surface treatment step according to the present invention.
Figure 5:
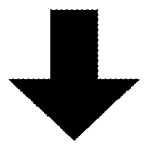
Figure 5:
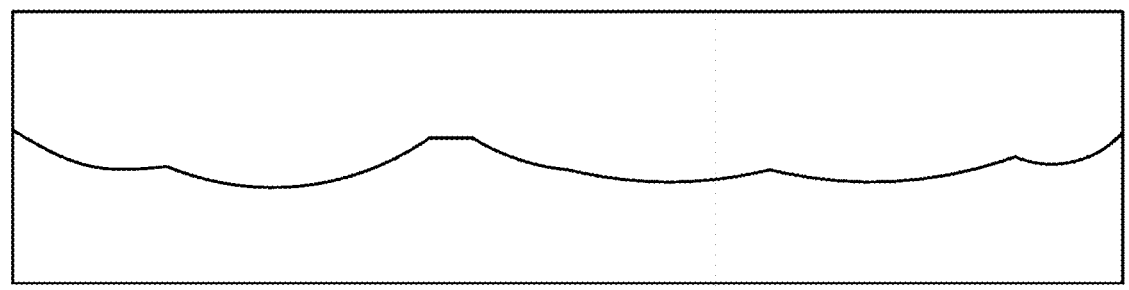

As illustrated in FIG. 5, the second surface treatment step S30 is a step of eliminating etching depth variation throughout the entire surface area, which occurs in the first surface treatment process S20, and of adjusting the surface roughness of the quartz member. This step minimizes delamination of deposits formed on the surface of the quartz member in the subsequent plasma processing process.

With the use of the low concentration etching solution, the size of the embossed patterns can be adjusted, the density of the embossed patterns can be increased, and the embossed patterns can be evenly distributed. The low concentration etching solution preferably includes fluoric acid (HF) and a second additive. The concentration of the fluoric acid (HF) in the low concentration etching solution is lower than that of the fluoric acid (HF) in the high concentration etching solution used in the first surface treatment step S20.

Preferably, an organic solvent is used as the second additive to more easily adjust the etching depth variation occurring in the first surface treatment step.

As the organic solvent, dimethylformamide, dimethyl sulfoxide, acetonitrile, tetrahydrofuran, methyl ethyl ketone, and dioxane is used solely or in combination.

The second surface treatment step is preferably performed at a lower temperature than the first surface treatment step to reduce the etch rate, thereby more precisely control the shape of the embossed patterns on the surface of the quartz member.

The quartz member resulting from the second surface treatment step preferably has a surface roughness Ra of 0.1 to 1 μm.

With the use of the surface treatment method according to the present invention, the surface of the quartz member can be uniformly etched. Therefore, the surface treatment method according to the present invention can be suitably used in application fields in which quartz members are frequently used.

Another aspect of the present invention provides a quartz member manufactured through the surface treatment method described above.

Preferably, the surface of the quartz member obtained through the surface treatment method has a maximum height difference Rt of 20 μm or less.

Hereinbelow, a preferred example will be presented to aid in understanding the present invention. However, the examples described below are provided only to facilitate understanding of the present invention and thus the details in the preferred example should not be construed to limit the scope of the present invention.

COMPARATIVE EXAMPLE

Embossing treatment of a quartz member was performed using a composition comprising HF in a fraction of 5 to 10 wt %, $NH_4HF_2$ in a fraction of 20 to 40 wt % HCOOH in a fraction of 50 to 70 wt %, and deionized water (18 MΩ or more) in a fraction of 5 to 10 wt %.

Figure 6:
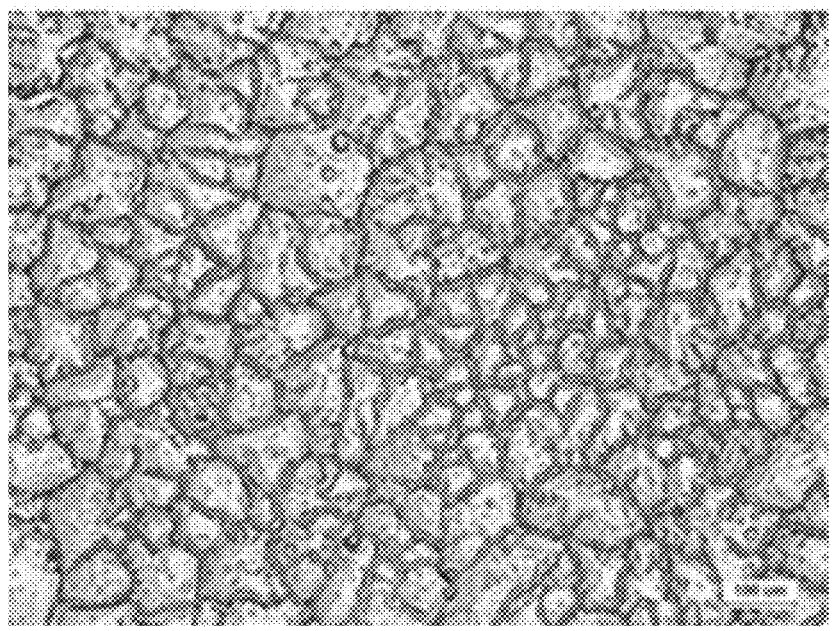
FIG. 6 is an image illustrating a surface of a quartz member having undergone a surface treatment method according to a comparative example.

As can be seen from the scanning electron microscope (SEM) image of FIG. 6, scratches are still left on the surface of a quartz member after the surface of the quartz member is treated with the composition.

EXAMPLE

The surface of a quartz member was primarily treated with a high concentration etching solution containing fluoric acid (HF) in a fraction of 20 to 50 wt % and $H_2SO_2$ in a fraction of 10 to 40 wt %. Next, the surface of the quartz member was secondarily performed with a low concentration etching solution containing fluoric acid (HF) and dimethylformamide.

Figure 7:
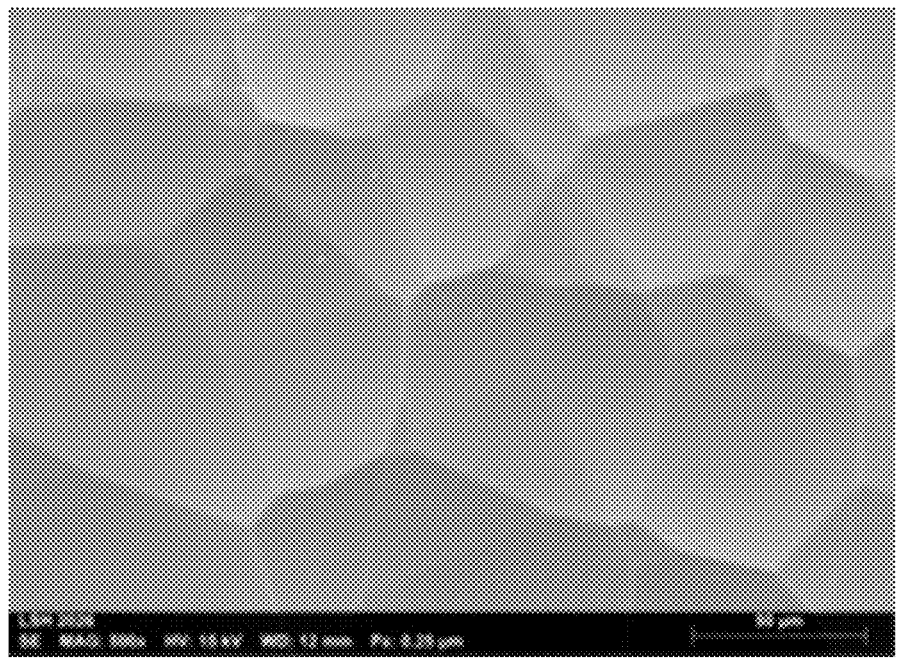
FIG. 7 is an image illustrating a surface of a quartz member having undergone a surface treatment method according to one embodiment of the present invention.

FIG. 7 is a SEM image of the surface of the quartz member obtained by Example. As illustrated in FIG. 7, unlike the surface resulting observed in Comparative Example 1, no scratches are present on the surface of the quartz member.

Although various embodiments of the present invention have been described above, the drawings and detailed description of the present invention are intended to illustrate the present invention and are not intended to limit the scope of the present invention. Therefore, those skilled in the art will appreciate that various modifications and equivalents thereto are possible. Accordingly, the true technical protection scope of the present invention should be determined by the technical idea defined in the appended claims.

What is claimed is:

1. A method of treating a surface of a quartz member, the method comprising:
    performing a first surface treatment step in which a top surface of a quartz member is etched with a first concentration etching solution to remove a scratch present on the top surface, wherein the first concentration etching solution includes fluoric acid (HF) at a first concentration and a first additive; and performing a second surface treatment step in which an etched surface of the quartz member resulting from the first surface treatment step is etched with a second concentration etching solution to adjust a roughness of the etched surface of the quartz member,
wherein the second concentration etching solution includes fluoric acid (HF) at a second concentration and a second additive,
wherein the second concentration is lower than the first concentration, and
wherein the first additive is different from the second additive.

2. The method according to claim 1,
wherein in the performing of the first surface treatment step, the quartz member is etched to a depth of 100 μm or more from the top surface.

3. The method according to claim 1,
wherein in the performing of the second surface treatment step, the quartz member resulting from the first surface treatment step is etched to have a surface roughness of 0.1 to 1 μm.

4. The method according to claim 1,
wherein the first additive is a material for removing by-products generated during etching.

5. The method according to claim 4,
wherein the first additive is sulfuric acid, nitric acid, or hydrochloric acid.

6. The method according to claim 4,
wherein the by-products include $(NH_4)_2SiF_6$ or $H_2SiF_6$.

7. The method according to claim 1,
wherein the second additive is an organic solvent.

8. The method according to claim 7,
wherein the organic solvent includes at least one of dimethylformamide, dimethyl sulfoxide, acetonitrile, tetrahydrofuran, methyl ethyl ketone, and dioxane.

9. The method according to claim 1,
wherein the first surface treatment step is performed at a first temperature, and
wherein the second surface treatment step is performed at a second temperature smaller than the first temperature.

10. The method according to claim 1,
wherein the quartz member is a member used in a plasma treatment apparatus or a member used in a state of being exposed to a plasma environment.

11. The method according to claim 1, further comprising:
performing a step of sandblasting the top surface of the quartz member prior to performing of the first surface treatment step.

12. A method of manufacturing a plasma treatment apparatus comprising a quartz member, the method comprising:
sandblasting a surface of the quartz member;
performing a first surface treatment step in which the sandblasted surface of the quartz member is etched with a first concentration etching solution containing fluoric acid (HF) at a first concentration and a first additive;
performing a second surface treatment step in which the etched surface of the quartz member resulting from the first surface treatment step is etched with a second concentration etching solution containing fluoric acid (HF) at a second concentration and a second additive; and
placing, after the performing the second surface treatment step, the quartz member in a plasma chamber,
wherein the second concentration etching solution includes fluoric acid (HF) at a second concentration and a second additive,
wherein the second concentration is lower than the first concentration, and
wherein the first additive is different from the second additive.

13. The method according to claim 12,
wherein after the performing of the second surface treatment step, the quartz member has a dome shape.

* * * * *